(12) United States Patent
Chao et al.

(10) Patent No.: US 6,184,149 B1
(45) Date of Patent: *Feb. 6, 2001

(54) METHOD FOR MONITORING SELF-ALIGNED CONTACT ETCHING

(75) Inventors: Li-Chih Chao, Taoyuan; Yuan-Chang Huang, Miao Li, both of (TW)

(73) Assignee: Taiwan Semiconductor Manufacturing Co., Ltd., Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/918,315

(22) Filed: Aug. 26, 1997

(51) Int. Cl.$^7$ .................................................. H01L 21/302
(52) U.S. Cl. ............................................ 438/734; 438/743
(58) Field of Search .................................. 438/689, 743, 438/723, 724, 734, 744

(56) References Cited

U.S. PATENT DOCUMENTS

| | | | |
|---|---|---|---|
| 3,664,942 | * 5/1972 | Havas et al. | 204/192 |
| 5,631,184 | * 5/1997 | Ikemasu et al. | 438/397 |
| 5,694,207 | * 12/1997 | Hung et al. | 356/72 |
| 5,783,496 | * 7/1998 | Flanner et al. | 438/743 |

OTHER PUBLICATIONS

A.J. VanRoosmalen et al., "Dry Etching for VLSI", Plenum Press, N.Y, 1991, p. 109.*

* cited by examiner

Primary Examiner—Benjamin L. Utech
Assistant Examiner—Kin-Chan Chen
(74) Attorney, Agent, or Firm—Harness, Dickey & Pierce, P.L.C.

(57) ABSTRACT

The present invention provides a method for monitoring a self-aligned contact (SAC) etching process. A wafer with an oxide layer serves as an oxide control wafer. The oxide layer is formed on the substrate. The oxide control wafer and a SAC wafer with SAC structure are simultaneously treated with a SAC etching process in an etching chamber with the same etching recipe. A contact hole is formed by etching the oxide layer of the oxide control wafer after the SAC etching process. The depth of a profile transition point and the depth of etching stop for the oxide control wafer can be observed by cross-section SEM. The profile transition depth in the oxide control wafer corresponds to the etching thickness of $S_iN$ corner loss in the SAC wafer. Therefore, the profile transition depth and the depth of etching stop in the oxide control wafer can be used to monitor the etching chamber condition.

22 Claims, 4 Drawing Sheets

METHOD FOR MONITORING SELF-ALIGNED CONTACT ETCHING

BACKGROUND OF THE INVENTION

1. Field of the Invention

The present invention relates to a method of fabricating integrated circuits, and more particularly, to a method for monitoring self-aligned contact etching.

2. Description of the Prior Art

With the development of the semiconductor process, the width of the metal line can be manufactured in a very narrow range. In an integrated circuit process, a contact hole provides an electrical connect for interconnections with the active region of a semiconductor device. Typically, the contact hole is formed using an etching process. The contact hole is typically generated by etching an insulator layer employing a photoresist as an etching mask. The contact hole provides a portion of active area of semiconductor device for interconnections between semiconductor devices. Referring to FIG. 1, semiconductor devices 4 such as transistor are formed over a semiconductor substrate 2. Sidewall spacers 6 and liner layer 8 are substantially formed on the substrate 2 by using a conventional deposition and etching process. An insulator layer 10 such as oxide is then deposited on the liner layer 8. A photoresist layer 12 is coated on the insulator layer 10 and patterned as an etching mask. Afterward, a self-aligned contact (SAC) etching process is performed with high etching selectivity of spacer or liner (for example $S_iN$) to insulator layer (for example oxide). The self-aligned contact (SAC) etching process can shrink the contact design rule.

During SAC etching, the reaction gas of carbon-fluorine-contained compounds under plasma generates polymer which can etch oxide layer with high etching selectivity of $S_iN$ film to oxide layer. However, too much polymer deposition may cause oxide layer 10 etching stop while insufficient polymer may result in undesirable etching loss of $S_iN$ spacer or liner layer. Therefore, a method to monitor the SAC etching chamber is important for mass production especially under such high polymer deposition condition. Generally, a wafer with SAC structure is etched and inspected by cross-section SEM for checking $S_iN$ loss and etching stop. However, wafers with SAC structure take a long preparation time and high cost in preparation. Generally, it spends time about three weeks to one month to finish complex steps from forming gate electrode to oxide layer. In addition, a few hundred angstrom SN loss is not easy to characterize. Therefore, a method is needed for accurately monitoring the chamber condition and the corresponding SN selectivity with low running cost.

SUMMARY OF THE INVENTION

It is a primary object of the present invention to provide a method for monitoring an etching process. The conventional method for monitoring self-aligned contact etching takes long wafer preparation time and involves a high cost in wafer preparation. The present inventions propose a novel method to monitor SAC etching at a low cost and with a rapid wafer preparation.

A semiconductor wafer is used as a control wafer in the present invention. A thick oxide layer is then formed on the substrate. The oxide control wafer is etched using a recipe that is the same as the SAC recipe. A photoresist pattern is formed on the oxide layer with a window of a contact hole. The width of the window is the same as that of the SAC etching process. After etching oxide control wafer, the contact hole is formed. Applying the SEM micrograph to inspect the cross-section profile of the contact hole, the depth of etching profile transition depth and the depth of etching stop can be observed in the oxide control wafer. The profile transition occurs when the polymer deposition rate is faster than the etching rate of the polymer. The depth of etching profile transition for the oxide control wafer corresponds to the etched thickness of the $S_iN$ corner loss for the SAC wafer. This depth of profile transition in the oxide control wafer can be used to monitor SAC etching chamber condition. Additionally, the depth of etching stop in the oxide control wafer can be employed for detecting the shift of chamber condition in early stage.

BRIEF DESCRIPTION OF THE DRAWINGS

The above features of the prevent invention will be more clearly understood from consideration of the following descriptions in connection with accompanying drawings in which.

DESCRIPTION OF THE PREFERRED EMBODIMENT

Figure 1:
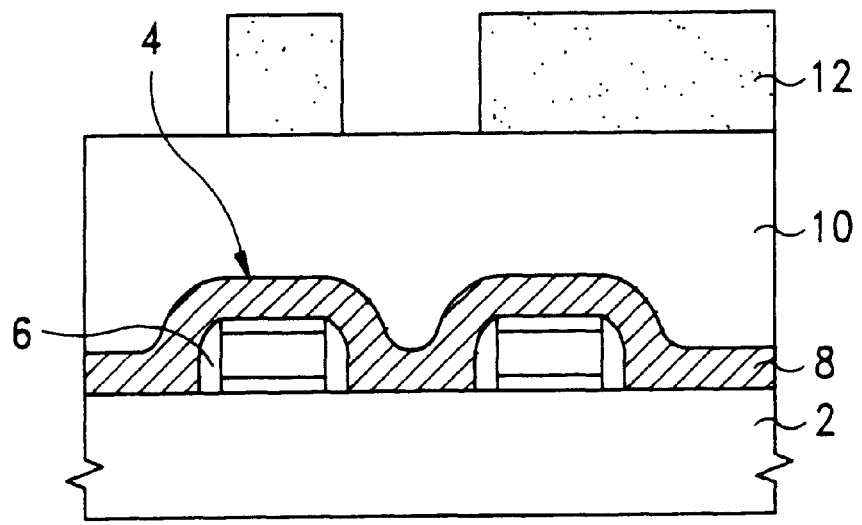
FIG. 1 is a cross-section view in accordance with a conventional SAC process.
Figure 2:
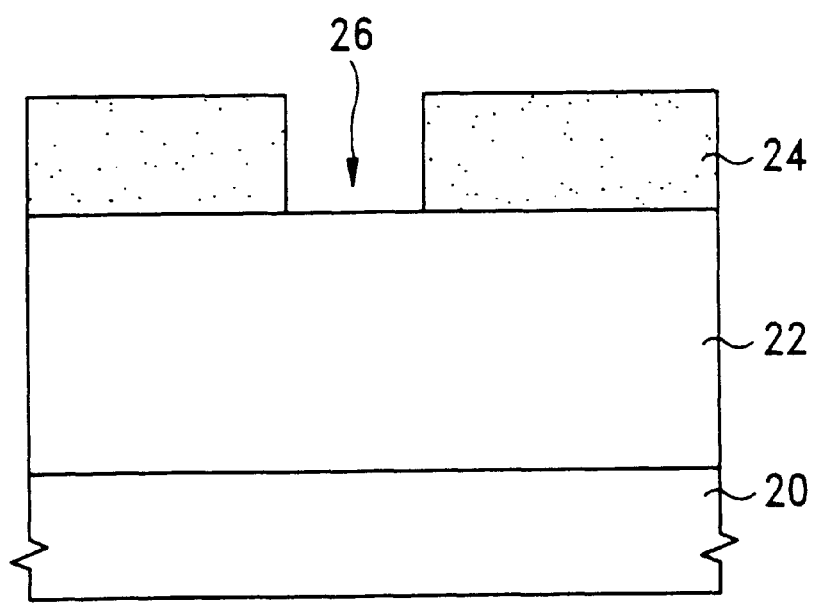
FIG. 2 is a cross-section view of etching an control wafer with thick oxide layer in accordance with the present invention.
Figure 3A:
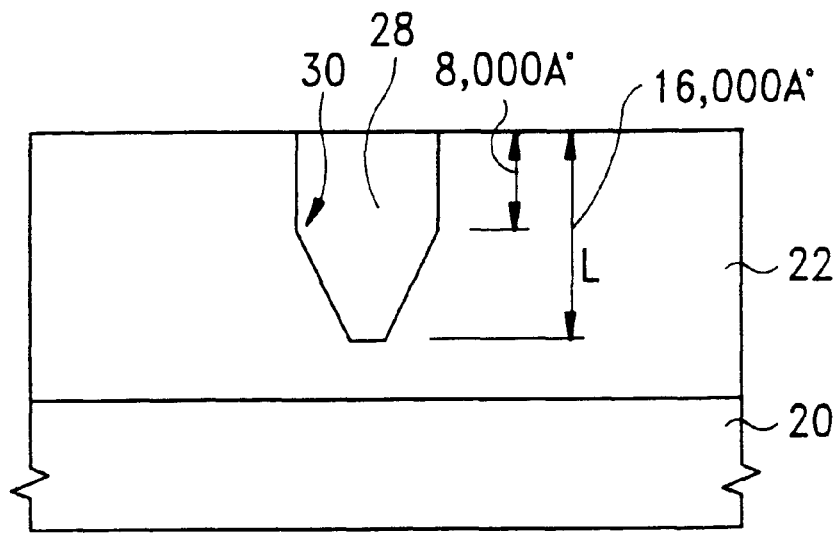
FIG. 3A is a drawing to show the depth of etching profile transition and the depth of etch stop for the oxide control wafer in accordance with the present invention.
Figure 3B:
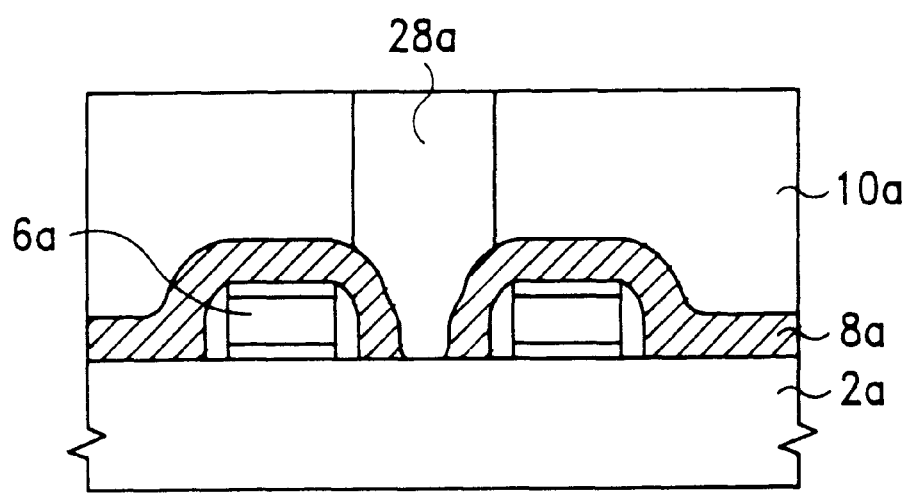
FIG. 3B is a drawing of the SAC wafer corresponding to the same recipe of FIG. 3A.

The present invention provides a method to monitor the SAC etching chamber condition. An oxide control wafer is utilized to observe the depth of etching profile transition and the depth of etching stop. By using the depth of etching profile transition and the depth of etching stop in the oxide control wafer in the present invention, the chamber condition can be monitored. The etching result for the oxide control wafer can be correlated back to the SAC etching for the SAC wafer. By changing the SAC etching recipe, the different monitoring results such as the profile transition depth and the depth of etching stop on the oxide control wafer are observed through SEM micrograph. These monitoring results are applied for detecting the shift of chamber condition using oxide control wafer instead of SAC structure wafer. The present invention is described as follows:

Referring to FIG. 2, a semiconductor substrate 20 is used as a control wafer. A thick oxide layer 22 is then formed over the substrate 20 by using a conventional method such as CVD deposition or thermal oxidation process. An etching process is performed on the oxide control wafers with the same SAC recipe. A photoresist pattern 24 is formed on the oxide layer 22 with a window 26 of a contact hole. The width of the window 26 is the same with that of the SAC etching process. By using the photoresist pattern 24 as an etching mask, the oxide layer 22 of the oxide control wafer is etched to form a contact hole. This etching recipe such as reaction gas and the gas flow rate is the same with the SAC recipe. The etching result is shown in FIG. 3A. From the FIG. 3A, the cross section view of the contact hole 28 is with a depth of profile transition 30 and a depth of etching stop "L". In the present embodiment, an etching process is performed on the oxide control wafer in HDP 5300 chamber. The reaction gases include $C_4F_8$, Ar, and $CH_3F$. The gas flow rates of the reaction gases are 11 sccm for $C_4F_8$, 50 sccm for Ar, and 8 sccm for $CH_3F$. The oxide layer is deposited in a thickness of about 18,000 angstroms. The dissociation power of plasma is set at approximately 1,200 watts to 1,800 watts. The energy of ion bombardment is in a range of approximately 1,200 watts to 1,800 watts. Referring to FIG. 3B, an etching process is performed on a SAC wafer with the same etching recipe to form a contact hole 28a. The SAC wafer has polysilicon gate electrode 6a, liner layer 8a and oxide layer 10a.

Figure 6:
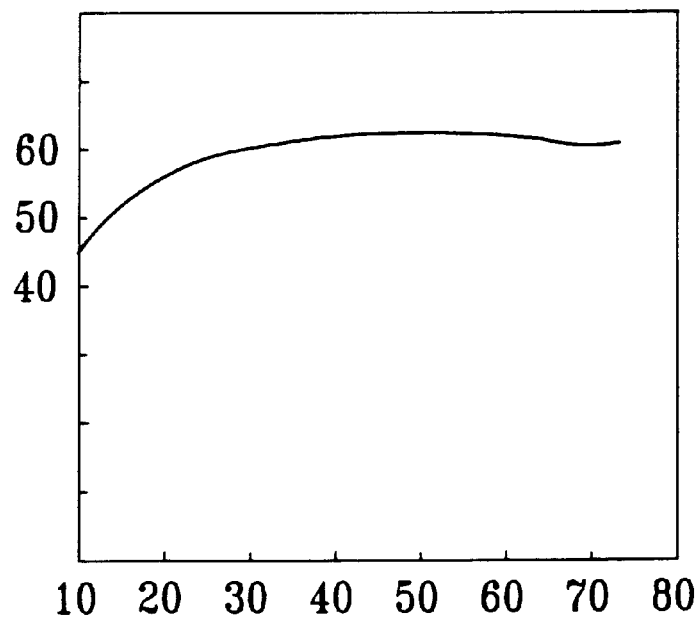
FIG. 6 is an optical emission spectrum view for a HDP 5300 chamber.

During etching the oxide control wafer process, a polymer is generated on the surface of the contact hole 28 due to the reaction of gas and the photoresist. The polymer deposition rate is slower than the polymer etching rate before the profile transition 30 is generated. Therefore, the variation of the etching rate is small such that the cross-section profile of the contact hole is steep. However, the polymer will deposit more and more with etching time. While the polymer deposition rate is sufficiently higher than the etching rate, the aspect ratio of the contact hole is increased. Additionally, the polymer deposited on the bottom of the contact hole is not easily bombarded by plasma, thus resulting in an etching stop. Referring to FIG. 3A, the depth of the etching stop is denoted by "L" that is about 16,000 angstroms and the depth of profile transition 30 is about 8,000 angstroms. The profile transition 30 is formed at the critical point that the polymer deposition rate is faster than the etching rate. Referring to FIG. 3B, the wafer with a SAC structure is etched via the same etching recipe of the oxide control wafer. In etching oxide layer 10a of the SAC wafer, the SiN liner layer 8a on the substrate 2a is etched to about 200 angstroms. The SiN corner loss is about 200 angstroms corresponding to profile transition at depth 8,000 angstroms for the oxide control wafer. The profile transition cannot be observed from the SAC wafer due to the fact that the corresponding profile transition point for the oxide control wafer is hidden behind the polysilicon gate electrode of the SAC wafer. This depth of profile transition in oxide control wafer can be used to monitor the SAC etching chamber. In the etching process, the amount of carbon-containing compounds is found to reach a saturation point by an optical emission spectrum analysis. Referring to FIG. 6, in the reaction chamber, the carbon ions generated by using plasma dissociating the carbon-fluorine-contained compounds are increasing during the reaction. The amount of carbon ions increases to a saturation amount. The amount of carbon ions represent the amount of the reaction gas correlated to the polymer deposition. By the optical emission spectrum analysis, the polymer deposition rate increases when the amount of carbon ions in the etching chamber increases. While the polymer deposition rate becomes higher than the polymer etching rate, the profile transition point will occur.

Figure 4A:
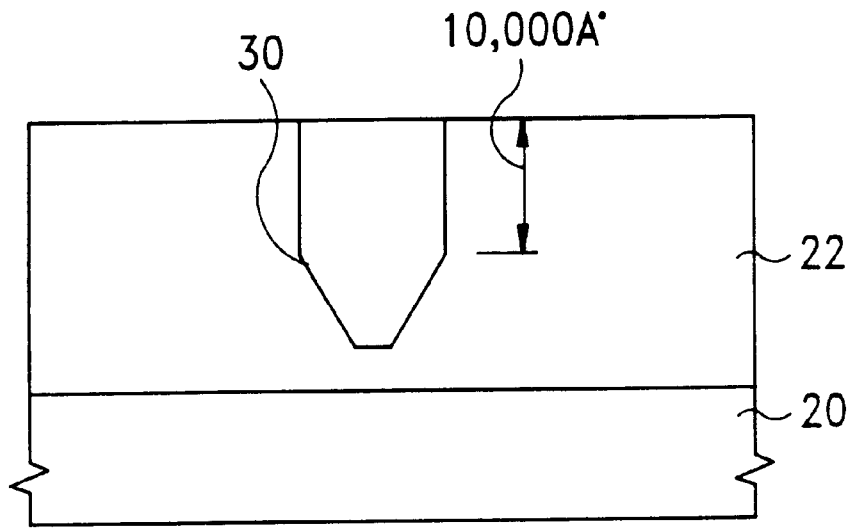
FIG. 4A is a drawing of a variation of the depth of etching profile transition with varying recipe.
Figure 4B:
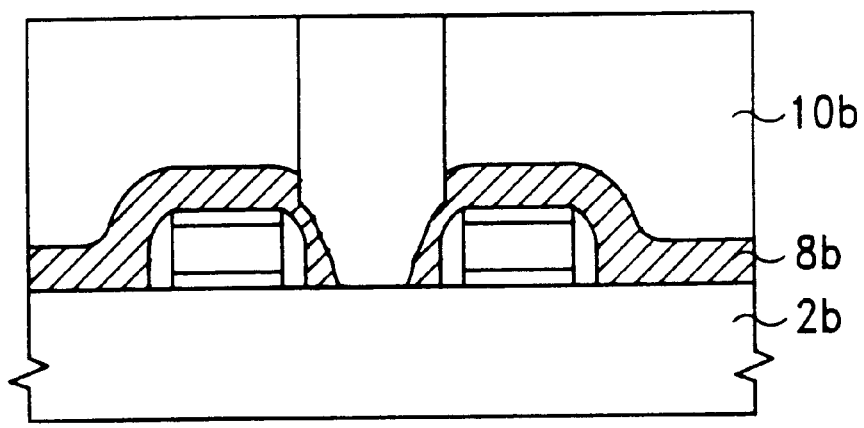
FIG. 4B is a drawing of the SAC wafer corresponding to the same recipe of FIG. 4A.

Referring to FIG. 4A, when the $CH_3F$ flow rate lowers from 8 sccm to 6 sccm, the depth of etching profile transition of standard 8,000 angstroms increases to 10,0000 angstroms. The reason is that the amount of polymer in the chamber is decreased. On the other hand, when the $CH_3F$ flow rate is increased, the depth of etching profile transition will be more shallow. The main reason for this is that decreasing the $CH_3F$ flow rate will result in the polymer deposition reduction. Therefore, a long time is required to reach the critical point of profile transition. This change of the depth of etching profile transition from 8,000 angstroms to 10,000 angstroms is due to the decreases in the $CH_3F$ flow rate. This result corresponds to the SAC wafer as shown in FIG. 4B. During etching of the oxide layer 10b, the etching loss of $S_iN$ 8b is about 400 angstroms using the same recipe as the oxide control wafer. Therefore, the depth of etching profile transition of the oxide control wafer can be used to monitor the $S_iN$ loss of the SAC wafer. The method of the present invention for monitoring the depth of the profile transition can be correlated back to the etching selectivity of the liner layer and the sidewall spacers. Therefore, the etching chamber condition can be monitored.

Figure 5:
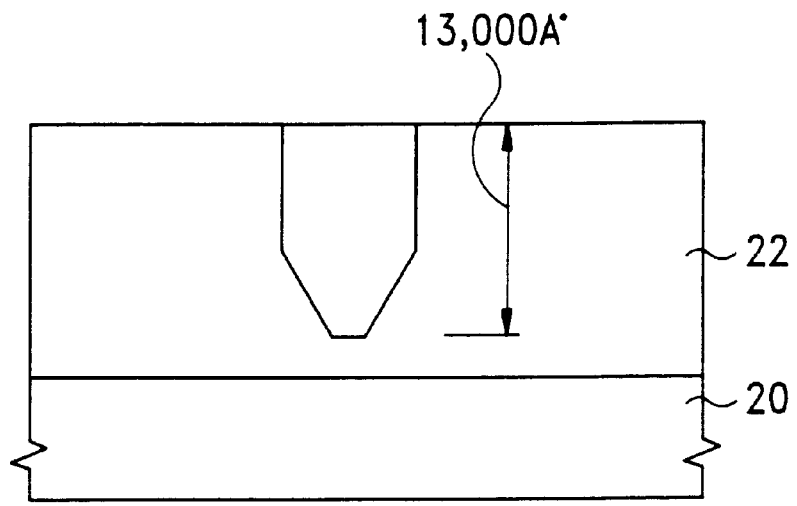
FIG. 5 is a drawing of a variation of the depth of etching stop with varying recipe.

Additionally, referring to FIG. 5, when the $C_4F_8$ flow rate increases from 11 to 12 sccm, the depth of etching stop of the oxide control wafer of 16,000 angstroms decreases to 13,000 angstroms. On the other hand, when the $C_4F_8$ flow rate decreases, the depth of the etching stop increases due to the decrease in the polymer deposition rate. However, this variation of etching stop cannot be detected from the regular SAC monitor wafer by SEM inspection because the depth of the etching stop is deeper than the thickness of the SAC oxide layer. However, the shift of chamber conditions can be detected in early stages by the oxide control wafer, and the recipe can be modified to suit the SAC etching process requirement. Generally, the variation of $CH_3F$ flow rate can change the depth of profile transition in oxide layer and the variation of $C_4F_8$ flow rate can change the depth of the etching stop.

Accordingly, a data base is generated using the method of the present invention. The data base includes the information of a set of $S_iN$ corner loss and the corresponding set of the depth of etching profile transition profile transition depth, a set of the depth of etching stop, a set of SAC chamber condition and a set of correlated SAC etching parameters. The data base is shown as follows:

|  | Chamber Condition |  | The Oxide Control Wafer | |
| --- | --- | --- | --- | --- |
| The SAC Process Recipe | The thickness of etching SiN | other | The depth of etching profile transition | The depth of etching stop |
| A1 | B1 | C1 | D1 | E1 |
| A2 | B2 | C2 | D2 | E2 |
| ... | ... | ... | ... | ... |
| A10 | B10 | C10 | D10 | E10 |

In accordance with the data base generated from the different results of the the depth of the etching profile transition and the depth of etching stop, the etching chamber condition can be monitored and adjusted. By the monitoring result, the amount of polymer deposition and the corresponding $S_iN$ corner loss can be determined. Therefore, in the present invention using the oxide control wafer without the SAC structure, the etching selectivity of the liner layer and sidewall spacers made of $S_iN$ can be monitored and adjusted. The oxide control wafer and the SAC wafer are performed with the etching process at the same time. The oxide control wafer composed of oxide film and the SAC photoresist pattern is etched by using the SAC baseline recipe. After the SAC etching, the oxide control wafer is inspected by cross-section SEM to monitor the chamber condition. In the present invention, applying an oxide control wafer without the SAC structure can reduce the cost and preparation time required for the SAC monitor wafer. The depth of etching stop cannot be observed when using the regular SAC structure to monitor the SAC chamber. The present invention method can effectively reduce the cost only by forming an oxide film on the substrate of the control wafer. Additionally, the method is very sensitive to the shift of the chamber condition and the depth of the profile transition correlated to $S_iN$ corner selectivity.

Although specific embodiments including the preferred embodiment have been illustrated and described, it will be obvious to those skilled in the art that various modifications may be made without departing from the spirit and scope of the present invention, which is intended to be limited solely by the appended claims. For example, the monitoring method in the present invention can be used to any etching process using $CH_3F$ and $C4H_8$ as reactants. In an other way, etching process using different reactants can be also monitored using similar method of inspecting transition depth and etching stop depth on a control wafer. Thus the spirit of the present invention shall not be limited to the example described as monitoring the etching selectivity of the liner layer and the sidewall spacers made of $S_iN$. It is therefore intended that the appended claims encompass any such modifications or embodiments.

What is claimed is:

1. (Amended) A method for monitoring self-aligned contact (SAC) etching process, said method comprising the steps of:
   providing a set of wafers with an oxide layer as a set of oxide control wafers;
   generating a data base which includes a set of depths of etching profile transition, a set of depths of etching stop, a set of SAC chamber conditions and a set of correlated SAC etching parameters;
   performing a SAC etching process to etch an oxide control wafer and a SAC wafer by a first gas $CH_3F$ and a second gas, said $CH_3F$ having a variable flow rate, wherein the flow rate variation of said $CH_3F$ changes said depth of etching profile transition, thereby a depth of etching profile transition and a depth of etching stop are generated in said oxide control wafer and said SAC wafer; and
   measuring said depth of etching profile transition and said depth of etching stop in said oxide control wafer to monitor said chamber condition of said SAC etching process.

2. The method of claim 1, wherein said data base is generated by etching said set of oxide control wafers using said set of SAC etching parameters and said SAC chamber conditions to generate said set of depths of etching profile transition and said set of depths of etching stop using said first gas and said second gas.

3. The method of claim 1, wherein as said $CH_3F$ flow rate decreases said depth of etching profile transition increases.

4. The method of claim 3, wherein said SAC wafer has semiconductor devices and a liner layer formed on said semiconductor devices, as said $CH_3F$ flow rate decreases an etched thickness of said liner layer increases.

5. The method of claim 1, wherein as said $CH_3F$ flow rate increases said depth of etching profile transition decreases.

6. The method of claim 6, wherein said SAC wafer has semiconductor devices and a liner layer formed on said semiconductor devices, as said $CH_3F$ flow rate increases said etched thickness of said liner layer decreases.

7. The method of claim 1, wherein said second gas is $C_4F_8$, as said $C_4F_8$ flow rate increases said depth of etching stop decreases.

8. The method of claim 1, wherein said second gas is $C_4F_8$, as said $C_4F_8$ flow rate decreases said depth of etching stop increases.

9. A method for monitoring self-aligned contact (SAC) etching process, said method comprising the steps of:
   providing a wafer with an oxide layer as an oxide control wafer;
   performing a SAC etching process in an etching chamber to etch said oxide control wafer and a SAC wafer by a first gas CH3F and a second gas, said $CH_3F$ having a variable flow rate, wherein the flow rate variation of said $CH_3F$ changes said depth of etching profile transition, thereby a depth of etching profile transition and a depth of etching stop are generated in said oxide control wafer and said SAC wafer; and
   measuring said depth of etching profile transition and said depth of etching stop in said oxide control wafer to monitor an etching chamber condition of said SAC etching process.

10. The method of claim 9, wherein as said $CH_3F$ flow rate decreases said depth of etching profile transition increases.

11. The method of claim 10, wherein said SAC wafer has semiconductor devices and a liner layer formed on said semiconductor devices, as said $CH_3F$ flow rate decreases an etched thickness of said liner layer increases.

12. The method of claim 9, wherein said $CH_3F$ flow rate increases said depth of etching profile transition decreases.

13. The method of claim 12, wherein said SAC wafer has semiconductor devices and a liner layer formed on said semiconductor devices, as said CH3F flow rate increases said etched thickness of said liner layer decreases.

14. The method of claim 9, wherein said second gas is $C_4F_8$, as said $C_4F_8$ flow rate increases said depth of etching stop decreases.

15. The method of claim 9, wherein said second gas is $C_4F_8$, as said $C_4F_8$ flow rate decreases said depth of etching stop increases.

16. A method for monitoring an etching process using $CH_3F$ and $C_4F_8$ as reactants, said method comprising the steps of:
   providing a wafer with an oxide layer as an oxide control wafer;
   performing said etching process in an etching chamber using said $CH_3F$ and said $C_4F_8$ as reactants to etch said oxide control wafer and a wafer with semiconductor devices, thereby a depth of etching profile transition and a depth of etching stop are generated in said oxide layer, said $CH_3F$ having a variable flow rate, wherein the flow rate variation of said $CH_3F$ changes said depth of etching profile transition; and
   measuring said depth of etching profile transition and said depth of etching stop in said oxide control wafer to monitor an etching chamber condition.

17. The method of claim 16 wherein as said $CH_3F$ flow rate decreases said depth of etching profile transition increases.

18. The method of claim 16, wherein said wafer with semiconductor devices has a liner layer formed on said semiconductor devices, as said $CH_3F$ flow rate decreases an etched thickness of said liner layer increases.

19. The method of claim 16, wherein as said $CH_3F$ flow rate increases then said depth of etching profile transition decreases.

20. The method of claim 19, wherein said wafer with semiconductor devices has a liner layer formed on said semiconductor devices, as said $CH_3F$ flow rate increases said etched thickness of said liner layer decreases.

21. The method of claim 16, wherein as said $C_4F_8$ flow rate increases said depth of etching stop decreases.

22. The method of claim 16, wherein as said $C_4F_8$ flow rate decreases said depth of etching stop increases.

* * * * *